United States Patent [19]
Choi et al.

[11] Patent Number: 5,837,380
[45] Date of Patent: Nov. 17, 1998

[54] MULTILAYER STRUCTURES AND PROCESS FOR FABRICATING THE SAME

[75] Inventors: Jae Hong Choi, Carmel; Chen-Chieh Lin, Indianapolis, both of Ind.; William Mitchel Gibbs, Benton; Carl J. Tiegelmann, Little Rock, both of Ark.

[73] Assignee: Lucent Technologies, Inc., Murray Hill, N.J.

[21] Appl. No.: 578,816

[22] Filed: Dec. 26, 1995

[51] Int. Cl.⁶ .............................. B32B 7/12; B32B 27/08; B32B 27/36

[52] U.S. Cl. ............................ 428/480; 428/910

[58] Field of Search ................... 428/480, 483, 428/910

[56] References Cited

U.S. PATENT DOCUMENTS

| | | | |
|---|---|---|---|
| 3,308,010 | 3/1967 | Engelhardt et al. | 161/231 |
| 4,198,458 | 4/1980 | Mitsuishi et al. | 428/212 |
| 4,887,178 | 12/1989 | McCracken et al. | 360/135 |
| 5,171,625 | 12/1992 | Newton | 428/195 |

Primary Examiner—Vivian Chen

[57] ABSTRACT

A substantially warp-free laminate polymeric film structure is obtained by a fabrication process in which the individual layers of polymeric film that are to be laminated together to form a card or similar structure are selected such that the mechanical properties of one layer or pair of layers are offset by those of another layer or layer pair wherein each polymeric film layer is bonded to its adjacent polymeric film layers by adhesive layers wherein the adhesive layers have a tack point temperature that is within 10° C. of the glass transition temperature of said polymeric film layers. The properties of the layers which may be subject to this consideration include, for example, the layer thickness, tensile strength, elongation factor, shrinkage rate, and machine processing direction. In an illustrative three-layer substrate embodiment of the present invention, the tensile strength, elongation factor, and shrinkage rate of the outer film layers of the substrate are the same, with the outer layers having a higher tensile strength value than the inner layer tensile strength. The orientation of the film's processing and machine direction and the orientation of the coil set of the film are also considered in arriving at a matched layer set.

5 Claims, 4 Drawing Sheets

MULTILAYER STRUCTURES AND PROCESS FOR FABRICATING THE SAME

FIELD OF THE INVENTION

The present invention relates to the fabrication of laminated structures from multiple layers of polymeric film.

DESCRIPTION OF THE BACKGROUND ART

Single and multiple layer substrates of polymeric material are commonly employed in the fabrication of credit, data, and identification cards. Multiple layer structures have also been employed in the fabrication of smart cards which, essentially, comprise an integrated circuit module or other electronic structure. The integrated circuit module may be programmed or programmable, with a set of instructions for controlling the use of the card. The integrated circuit module may also have a memory in which data may be stored and from which data may be retrieved.

When electronic devices are formed on a layer of polymeric film such, for example, as polyethylene terephthalate (PET), dislocation of and/or damage to the devices may result from deformation or curling of the final laminated structure. Moreover, when a fine pattern is to be formed in the device, as by photolithography, elongation or shrinkage of the substrate may cause a shift of a portion of the pattern. As such, to avoid damage to the integrated circuit module and attendant electrical connections, and also for aesthetic reasons, it is of particular importance that the laminated card structure be substantially uniform and warp-free.

It is, unfortunately, very difficult to predict the final dimensions of the individual layers after a multiple layer substrate has been heated to the tact point temperature of the adhesive, which heating is necessary to ensure complete adhesion between adjacent layers. Specifically, the application of heat to a laminated multiple layer polymeric substrate causes the material to expand. As the structure cools, expansion is followed by contraction, thereby causing internal stresses to develop within the structure. Undesirably, these internal stresses act to bend, twist, push, and pull the card, ultimately producing warp.

In an effort to minimize the internal stresses discussed above, manufacturers of polymeric films such as PET typically subject the film to a heat stabilization process. The heat-stabilized film is then supplied in rolls for use in the lamination process, with material selected from the center cut portion of the roll being preferred as having the lowest concentration of developed stresses. Experience by the inventors herein in laminating various PET formulation films into multiple layer structures has repeatedly shown, however, that heat stabilization and use of the center cut portion of the roll do not always resolve the problem of warpage. In fact, the repeatability of laminating warp free structures has remained unpredictable, resulting in an unacceptably high reject rate on the final product and correspondingly higher manufacturing costs.

Attempts have also been made to address the problem of warpage through tightening of the material specification process. For example, the use of certain combinations of high tensile strength and lower tensile strength PET films in the lamination of multiple layer structures has produced structures without significant warpage. Here again, however, the frequency of success has not been uniform and yields remain unpredictable. Moreover, the imposition of tighter specifications on film suppliers has made the desired material both more expensive and more difficult to obtain.

Accordingly, there exists a need for a reliable and economical process of fabricating a substrate from multiple layer of polymeric film.

SUMMARY OF THE INVENTION

According to the present invention, a substantially warp-free laminate structure is obtained by a fabrication process in which the individual layers of polymeric film that are to be laminated together to form a card or similar structure are selected such that the mechanical properties of one layer are offset by those of another layer. The properties of the layers which may be subject to this consideration include, for example, the layer thickness, tensile strength, elongation factor, shrinkage rate, and machine processing direction. In an illustrative three-layer substrate embodiment of the present invention, the tensile strength, elongation factor, and shrinkage rate of the outer film layers of the substrate are the same, with the outer layers having a higher tensile strength value than the inner layer tensile strength.

BRIEF DESCRIPTION OF THE DRAWINGS

The features and advantages of the present invention will be more readily understood from the following detailed description when read in conjunction with the accompanying drawings, in which.

DETAILED DESCRIPTION OF THE INVENTION

Initially, it will be noted that the phrase polymeric substrate as recited herein is intended to include substrates made of a polymeric fill or a sheet and, as the polymeric, polyethylene terephthalate (PET), polyethylene napthalene (PEN), polyarylate, polyether sulfone, polycarbonate, polyethylene, polymethyl methacrylate and polyimide can be exemplified. Moreover, as utilized herein, the phrase substantially warp-free is intended to refer to multiple layer structures having less than 6 mm warp.

Figure 1:
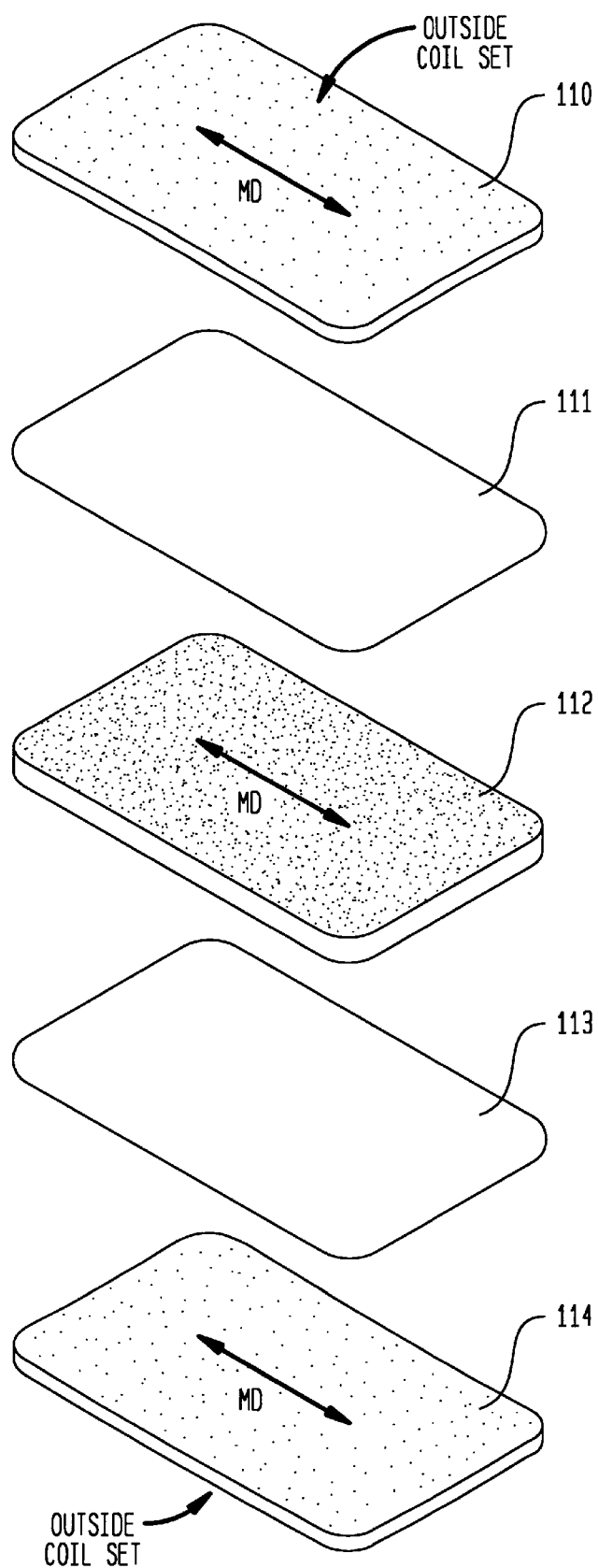
FIG. 1 is an exploded perspective view of a three layer polymeric structure constructed in accordance with the present invention.

The layers of polymeric film that are to be laminated together to form the substrate of a card or similar structure are, essentially, selected such that the mechanical properties of one layer come as close as possible to negating those of another layer. This selection process may be best understood by reference to FIG. 1 in which there is shown an illustrative structure 10 comprising three layers of a polymeric film such, for example, as PET. As seen in FIG. 1, structure 10 includes a central layer 112 disposed between upper and lower outer layers 110 and 114, each adjacent layer having an adhesive layer 111, 113 disposed therebetween. In accordance with the present invention, the outer two layers 110 and 114 must be of the same material, thickness, tensile strength, elongation factor, and shrinkage rate. The corresponding layer of adhesive coating 111, 113 between the inner layer 112 and outer layers 110 and 114, respectively, is also of the same material and coating thickness.

Figure 2:
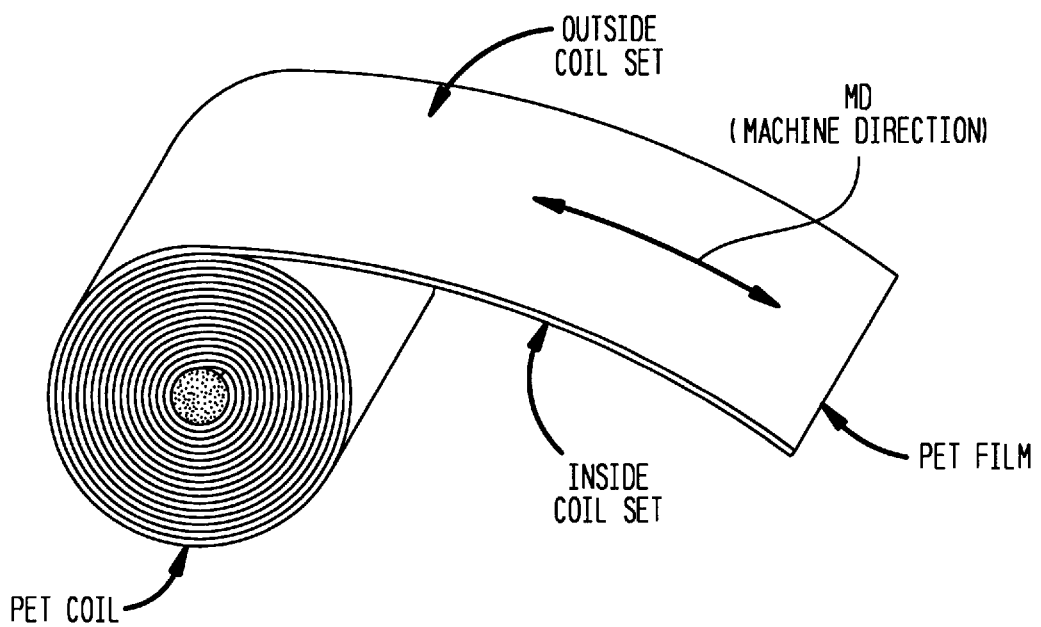
FIG. 2 is a simplified diagram depicting the manner in which a roll of fill is supplied for use in accordance with the teachings of the present invention.

In addition to the inherent mechanical properties discussed above, certain aspects of the film manufacturing process must also be considered in obtaining an appropriately matched set of outer layers as layers 110 and 114. Specifically, and as best shown in the illustrative roll of film 20 shown in FIG. 2, the orientation of the film's processing and machine direction MD and the orientation of the coil set of the film must also be ascertained in order to achieve a layer match acceptable for the purposes of the present invention. The each of said plurality of polymeric film layers has a machine processing direction and are positioned, during said positioning step, with their machine direction in substantially parallel alignment.

Returning to FIG. 1, it will be seen that for each of outer layers 110 and 114, the machine direction MD is identical. In accordance with an especially preferred embodiment of the present invention, the orientation of the machine direction of each layer is parallel to the longitudinal axis of the substrate to be fabricated. Moreover, the orientation of the coil (reel) set for the outer layers as layers 110 and 114 are preferably in opposite directions. The orientation of the coil set is defined by the positions of the inner (ICS) and outer (OCS) sides of the film as it is unwound from a coil. The inventors herein have noted that the film usually takes a set to the curvature of the coil. By taking this curvature into consideration in accordance with the present invention, it is possible to prevent stresses attributable to the coil set from affecting the stability of the final laminate structure. Accordingly, if top outer layer 110 has the orientation of the coil set with the outside surface facing up, then outer layer 114 must have the orientation of the coil set with the outside surface facing down.

Figure 3:
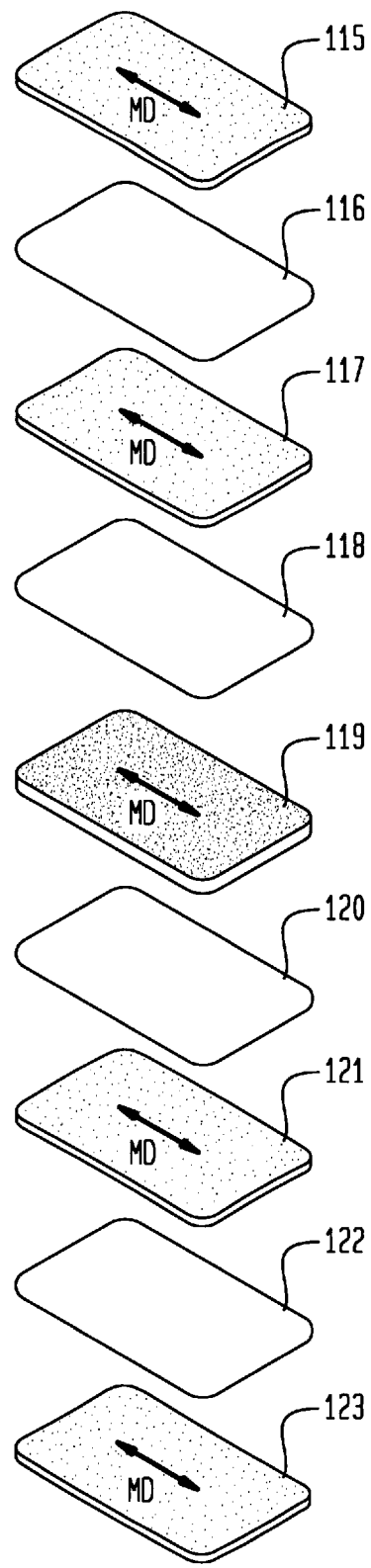
FIG. 3 is an exploded perspective view of a five layer polymeric structure constructed in accordance with the present invention.

With reference now to FIG. 3, it should be noted that the fabrication of structures with more than three film layers proceeds with considerations that are essentially the same as those discussed in connection with the structure of FIG. 1. For example, the construction of the five layer structure 30 of FIG. 3 would require the inner two layers 117 and 121 to have matching properties, while the outer two layers 115 and 123 would also be matched. As seen in FIG. 3, the orientation of the film's MD polarity and coil set of the respective outerlayers are selected in the same manner as described above for the structure of FIG. 1. The structure of FIG. 3 further includes an interior layer 119, with individual layers of adhesive 116, 118, 120, and 122 being disposed between the individual layers. Since the primary objective in orienting the individual layers of structures fabricated in accordance with the present invention is to achieve as balanced a structure as possible, it is believed that the best results are achieved by using the film made from the same master roll for the opposite mating film layers as, for example, layers 110 and 114 of FIG. 1, or layers 115 and 123 of FIG. 3.

An additional design consideration in fabricating multiple layer substrates in accordance with the present invention is the selection of the mechanical properties for the film used in the outer layers versus the inner layer(s). In accordance with a preferred embodiment of the present invention, the outer layers must have a higher tensile strength value than that of the inner layer. Selecting a higher tensile strength material for the outer layer allows the outer layers to control the behavior of the inner layer(s). Specifically, the inventors herein have found that a high differential in tensile strength between the inner and outer layers plays a significant role in limiting the problem of warpage in the completed, laminate structure. So long as the outer layers are matched to possess substantially the same physical and mechanical properties, the stresses due to elongation and contraction during each lamination cycle will act to place balanced tensions onto the inner layer.

Yet another design consideration in fabricating multiple layer substrates in accordance with the present invention is proper selection of the adhesive used to laminated the layers together. In accordance with an illustrative embodiment of the present invention, in which the film layers are comprised of PET, a modified polyester adhesive having a tact point temperature that closely matches the glass transition temperature of the film is employed. Preferably, the temperature at which the adhesive starts to solidify and adhere the layers together during the cooling process is within ten (10) degrees of the glass transition point of the laminate film. Keeping the tack point temperature as close as possible to the glass transition temperature reduces the amount of internal stresses developed in the PET film and thus reduces the possibility of warping in the completed structure.

Figure 4:
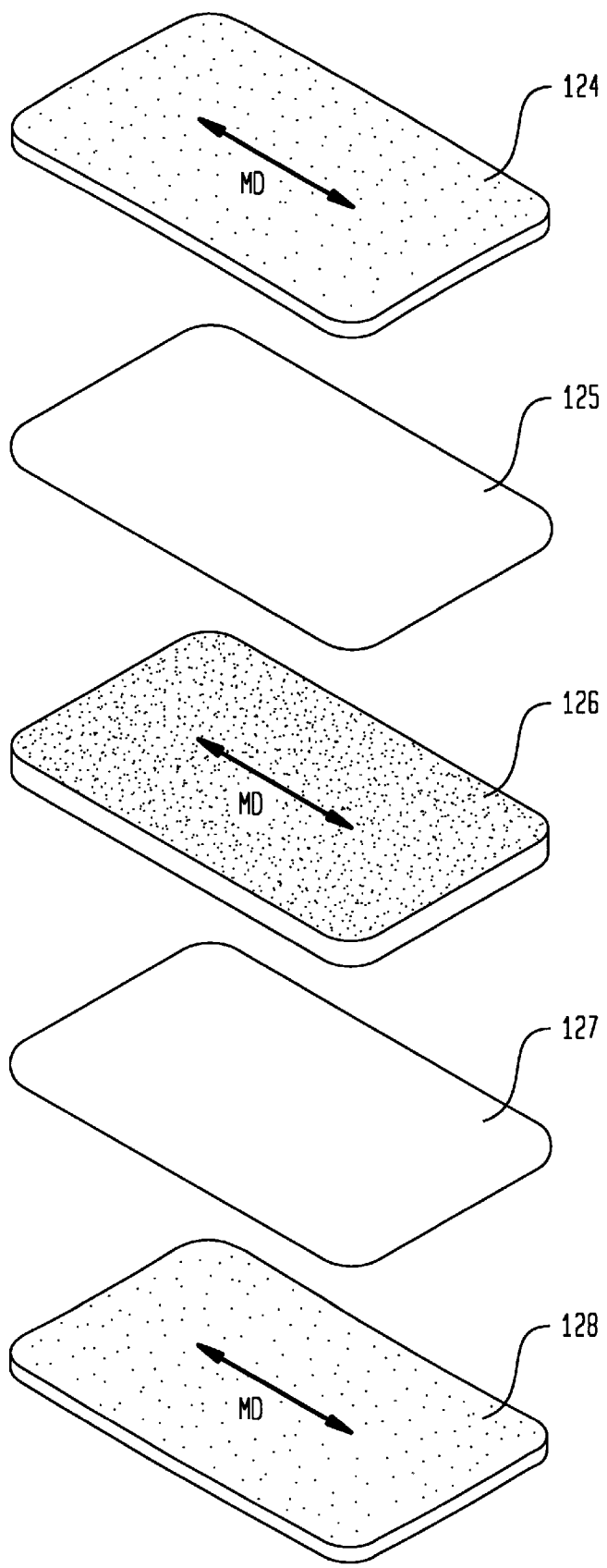
FIG. 4 is an exploded perspective view of a multiple layer structure constructed in accordance with a preferred embodiment of the present and having formed on a layer thereof an electronic circuit.

A consideration of particular importance when one the film layers comprising a laminated structure must accommodate an electronic circuit is the need to offset any imbalances in temperature processing. Referring to the illustrative structure of FIG. 4, there is shown such a structure, designated generally at 40. Of the outer film layer pair consisting of layers 124 and 128, only film layer 128 will be subjected to the conventional imaging and plating steps that typically involve a number of elevated temperature cycles. In accordance with an illustrative embodiment of the present invention, the imbalance in temperature processing between the pair of outer layers is corrected by subjecting them to a temperature equalizing step. Specifically, the outer layers are each subjected to a stabilization temperature that is equal to, or exceeds, the final lamination temperature. Illustratively, the outer layers are maintained at the stabilization temperature for about one hour and allowed to cool slowly back to room temperature. The film layers should remain flat for the duration of heating and cooling and during any additional processing for a 24 hour to 7 day period before any unsupported processing or handling can be performed.

During final temperature processing, the substrate of superposed polymeric film layers and adhesive is maintained in a flat position and the pressure is maintained as low as the process will allow. The temperature of all layers must reach the lamination temperature together before the cooling cycle is started. Temperature profiling of the ramp temperature of the film layers in a stack should be monitored to determine the actual temperature of the inner layers. The cooling must also be done under flat conditions with little or no pressure to permit each film layer to shrink back to its original dimensions. Any further unsupported processing must be performed only after the laminated structure has remained flat for a minimum of 24 hours.

EXAMPLE 1

A substantially warp-free multiple layer structure was fabricated according to the process as follows. To form the printed wiring board layer, a 35 micron thick layer of copper foil was bonded to a 125 micron thick layer of PET film commercially available from Toray Corp. of Japan as 2 PET S56 by a 25 micron thick layer of polyester adhesive having a tack point temperature of 75° C. The glass transition temperature of the PET film is 70°–85° C.

The printed wiring board layer was patterned and etched, and then plated, in a conventional manner, with nickel and gold to accommodate wire bonding of electronic devices. Electronic devices were then bonded to the wiring board layer using an electrically conductive epoxy supplied. The structure was then bonded to a 250 micron thick stiffener layer of PET film, commercially available from Toray Corp.

as 2 PET S10 with a 40 micron thick layer of an adhesive having a melt temperature of 140°–150°. Prior to bonding, the stiffener layer was punched with holes to accommodate the injection of an epoxy encapsulant over the bonded devices. The structure was heated to 80° C. for 30 minutes and the devices were interconnected by wire bonding. An epoxy encapsulant was injected over the devices, completely filling the holes in the 250 micron thick stiffener layer. A second stiffener layer of 2 PET S56, also of 125 microns in thickness, was then bonded to the stiffener layer with a 35 micron thick layer of HMP-2 adhesive.

A first lamination process was then performed by heating the completed multilayer structure to a temperature of 100° C. for 15 minutes and then cooling it to room temperature. A temperature cure for the epoxy used to hold the electronic components in place was then performed at a temperature of 80° C. for two hours. A second lamination process was then performed by heating the structure to a temperature of 160° C. for one hour and cooling it to room temperature for 15 minutes. Finally, a label layer was applied to each side of the structure and laminated thereto by heating the structure to 150° C. for 15 minutes and then cooling it for 15 minutes.

The structure was measured for flatness and had less than 3 mm warp.

EXAMPLE 2

Six substantially warp-free multiple layer structures, each with 3 PET layers and two printed wiring board layers, were constructed as follows:

To form the printed wiring board layers, a 3 mil thick layer of copper foil was bonded to each of two 10 mil thick layers of ASTM D1708 PET film commercially available from Toray Corp. of Japan as 2 PET S56 by a 4 mil thick layer of polyester adhesive having a tack point temperature of 75° C. The glass transition temperature of the PET film was 70°–80° C. Before copper cladding, the film had a tensile strength and breaking force of <20K psi and <22 lbs, respectively, in the machine direction and <22K psi and <25 lbs, respectively, in the transverse direction. The residual shrinkage of the PET layers was <0.2% in the machine direction and <0.15% in the transverse direction.

A 14 mil thick layer of ASTM D638 PET film commercially available from Teijin Corp. of Japan was bonded to each foil layer by a 4 mil thick layer of polyester adhesive having a tack point temperature of 75° C. A first lamination process was then performed by heating the completed multilayer structure to a temperature of 100° C. for 15 minutes and then cooling it to room temperature. A temperature cure for the epoxy used to hold the electronic components in place was then performed at a temperature of 80° C. for two hours. A second lamination process was then performed by heating the structure to a temperature of 160° C. for one hour under low pressure and cooling it to room temperature for 15 minutes. Finally, a label layer was applied to each side of the structure and laminated thereto by heating the structure to 150° C. for 15 minutes and then cooling it for 15 minutes.

The structures were measured for flatness and had less than 4 mm warp. The measured warp before each phase of the process, in mm, is tabulated below for six samples in table I:

TABLE 1

| Sample | 1st Lamination (100° C.) warp | 80° C. Cure warp | 2nd Lamination warp | Label |
|---|---|---|---|---|
| 1 | 3 | −2 | −5 | −3 |
| 2 | 2 | −2 | −6 | 0 |
| 3 | 2 | −3 | −8 | 0 |
| 4 | 3 | −3 | −7 | −3 |
| 5 | 2 | −3 | −7 | −3 |
| 6 | 3 | −2 | −11 | −4 |

From the foregoing, it should be readily ascertained that the invention is not limited by the embodiments described above which are presented as examples only but may be modified in various ways within the intended scope of protection as defined by the appended patent claims.

What is claimed is:

1. A substantially warp-free laminated polymeric substrate, comprising:

a plurality of layers of polymeric film, each of said polymeric film layers having internal and thermal stresses not equal to zero, the plurality of layers including at least a first, a second and a third polymeric film layer wherein the first polymeric film layer is positioned between the second and the third polymeric film layers to form a multiple layer structure; the first, second and third polymeric film layers each having a tensile strength, an elongation factor and a shrinkage rate, and a plurality of adhesive layers, each of said adhesive layers being disposed between a corresponding pair of adjacent polymeric firm layers;

wherein said second and third polymeric film layers define an outer pair of said multiple layer structure; and wherein the tensile strength, elongation factor and shrinkage rate of the second polymeric film layer are substantially equal to, respectively, the tensile strength, elongation factor and shrinkage rate of the third polymeric film layer, and the tensile strengths of the second and third polymeric film layers are each greater than the tensile strength of the first polymeric film layer, and wherein said adhesive layers have a tack point temperature that is within 10° C. of the glass transition temperature of said polymeric film layers.

2. The polymeric substrate of claim 1, wherein said second and third polymeric film layers comprise polyethylene terephthalate.

3. The polymeric substrate of claim 1, wherein each of said plurality of polymeric film layers has a machine processing direction wherein the polymeric film and are positioned with their machine processings directions in substantially parallel alignment.

4. The polymeric substrate of claim 3, wherein each of said plurality of polymeric film layers is oriented so that the machine processing direction of each polymeric film layer is parallel to a longitudinal axis of said laminated polymeric substrate.

5. The polymeric substrate of claim 3, wherein each of said plurality of polymeric film layers has a coil set orientation and wherein said second and third polymeric film layers are positioned with opposing coil set orientations.

* * * * *